(12) United States Patent
Jonnalagadda et al.

(10) Patent No.: US 10,600,958 B2
(45) Date of Patent: Mar. 24, 2020

(54) RESISTIVE MEMORY DEVICE

(71) Applicants: INTERNATIONAL BUSINESS MACHINES CORPORATION, Armonk, NY (US); Rheinisch-Westfälische Technische Hochschule (RWTH) Aachen, Aachen (DE)

(72) Inventors: Vara S. P. Jonnalagadda, Wallisellen (CH); Benedikt J. Kersting, Rueschlikon (CH); Wabe W. Koelmans, Adliswil (CH); Martin Salinga, Thalwil (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/225,318

(22) Filed: Dec. 19, 2018

(65) Prior Publication Data

US 2019/0148635 A1    May 16, 2019

Related U.S. Application Data

(63) Continuation of application No. 15/715,214, filed on Sep. 26, 2017, now Pat. No. 10,283,704.

(51) Int. Cl.
*G11C 13/00* (2006.01)
*G11C 11/56* (2006.01)
*H01L 45/00* (2006.01)

(52) U.S. Cl.
CPC .......... *H01L 45/06* (2013.01); *G11C 11/5678* (2013.01); *G11C 13/0004* (2013.01);
(Continued)

(58) Field of Classification Search
CPC .............. G11C 13/004; G11C 13/0004; G11C 13/0069; G11C 11/5678
(Continued)

(56) References Cited

U.S. PATENT DOCUMENTS 7,626,859 B2 * 12/2009 Suh .................... G11C 13/0004
                                                365/100
7,807,989 B2 * 10/2010 Lee ......................... H01L 45/06
                                                257/2

(Continued)

OTHER PUBLICATIONS

Sep. 26, 2017, U.S. Appl. No. 15/715,214.
(Continued)

*Primary Examiner* — Son L Mai
(74) *Attorney, Agent, or Firm* — Michael A. Petrocelli

(57) ABSTRACT

The invention is directed to a resistive memory device comprising a control unit for controlling a memory cell of the memory device. The memory cell includes a first terminal, a second terminal and a phase change segment comprising a phase-change material. The phase change segment is arranged between the first terminal and the second terminal. The phase change material is antimony. The phase change segment retains an amorphous region during a write operation. The control unit, during the write operation, applies an electrical programming pulse to the terminals to cause a portion of the phase change segment to transition from a crystalline phase to an amorphous phase comprising the amorphous region. A trailing edge duration of the electrical programming pulse is adjusted based on ambient temperature to prevent re-crystallization of the amorphous region. Shorter trailing edge durations are used at increasing ambient temperatures.

20 Claims, 6 Drawing Sheets

(52) U.S. Cl.
CPC ........ *G11C 13/004* (2013.01); *G11C 13/0069* (2013.01); *H01L 45/122* (2013.01); *H01L 45/124* (2013.01); *H01L 45/1226* (2013.01); *H01L 45/1246* (2013.01); *H01L 45/144* (2013.01); *H01L 45/148* (2013.01); *G11C 2013/005* (2013.01); *G11C 2013/0092* (2013.01); *G11C 2213/15* (2013.01); *G11C 2213/52* (2013.01)

(58) Field of Classification Search
USPC .................................................. 365/148, 163
See application file for complete search history.

(56) References Cited

U.S. PATENT DOCUMENTS

| | | | |
|---|---|---|---|
| 7,838,329 B2 | 11/2010 | Hunks | |
| 7,965,545 B2* | 6/2011 | Savransky | G11C 13/0004 365/148 |
| 8,378,328 B2 | 2/2013 | Breitwisch | |
| 8,877,549 B2 | 11/2014 | Roeder | |
| 9,117,519 B2* | 8/2015 | Spessot | G11C 11/5678 |
| 9,218,876 B2* | 12/2015 | Spessot | G11C 13/0002 |
| 9,337,421 B2 | 5/2016 | Chin | |
| 9,520,190 B2* | 12/2016 | Boniardi | G11C 13/0004 |
| 10,283,704 B2 | 5/2019 | Jonnalagadda | |
| 2011/0149645 A1 | 6/2011 | Liu | |
| 2014/0003123 A1 | 1/2014 | Karpov | |
| 2014/0117302 A1 | 5/2014 | Goswami | |
| 2014/0246642 A1 | 9/2014 | Liu | |
| 2015/0001457 A1 | 1/2015 | Krebs | |

OTHER PUBLICATIONS

Bichler et al., "Visual Pattern Extraction Using Energy-Efficient "2-PCM Synapse" Neuromorphic Architecture", IEEE Transactions on Electron Devices, vol. 59, No. 8, Aug. 2012, pp. 2206-2214.
Cheon et al., "Non-Resistance Metric based Read Scheme for Multi-level PCRAM in 25nm Technology", 2015 IEEE, 4 pages.
Gholipour et al., "Low current consuming thermally stable sulphide phase change memory", J Mater Sci: Mater Electron, Apr. 24, 2015, vol. 26, pp. 4763-4769.
Gholipour et al., "Ultra Low Power Consuming, Thermally Stable Sulphide Materials for Resistive and Phase Change Memristive Application", Frontiers in Electronic Materials, Germany, Jun. 17-21, 2012, 2 pages.
Koelmans et al., "Projected phase-change memory devices", Nature Communications Article, Sep. 3, 2015, pp. 1-7.
Kuzum et al., "Nanoelectronic Programmable Synapses Based on Phase Change Materials for Brain-Inspired Computing", Published: Jun. 14, 2011, Nano Letters, vol. 12, (2012), pp. 2179-2186.
Maki, Abstract for "Crystallization Thickness of Amorphous Sb Film on GeOx Film Substrate in a Vacuum of 10-5 Torr", Japanese Journal of Applied Physics, vol. 19, No. 11, May 14, 1980, 3 pages.
Papandreou et al., "Programming Algorithms for Multilevel Phase-Change Memory", 2011 IEEE, pp. 329-332.
Raoux et al., "Phase-change random access memory: A scalable technology", IBM J. Res. & Dev. vol. 52, No. 4/5, pp. 465-479, Jul./Sep. 2008.
Sebastian et al., "Non-resistance-based cell-state metric for phase-change memory", Journal of Applied Physics, vol. 110, 084505, (2011), published online: Oct. 21, 2011, pp. 1-6.
Tuma et al., "Stochastic phase-change neurons", Nature Nanotechnology, Published Online: May 16, 2016, pp. 1-8.
Wuttig et al., Review Abstract, "Phase-change materials for rewriteable data storage", Nature Materials, vol. 6, pp. 324-832, (2007).
Zhong et al., Abstract for "Formation of monatomic metallic glasses through ultrafast liquid quenching", Nature | Letter, vol. 512, pp. 177-180, Aug. 14, 2014.
Jonnalagadda et al., "Resistive Memory Device", U.S. Appl. No. 15/715,214, filed Sep. 26, 2017, 42 pages.
IBM Appendix P, list of patents and patent applications treated as related, Filed Herewith, 2 pages.
International Search Report and Written Opinion, International Application No. PCT/IB2018/056992, International Filing Date Sep. 13, 2018.
Jonnalagadda, et al., "Resistive Memory Device", Application No. PCT/IB2018/056992, International Filing Date Sep. 13, 2018, 45 pages.

* cited by examiner

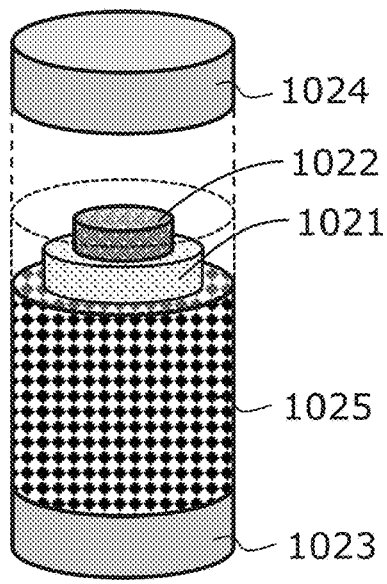
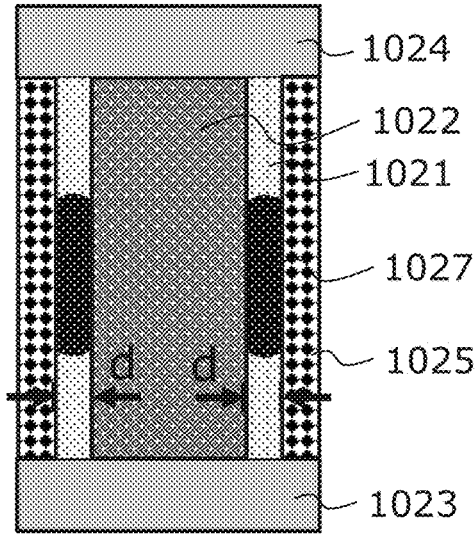
FIG. 10a    FIG. 10b
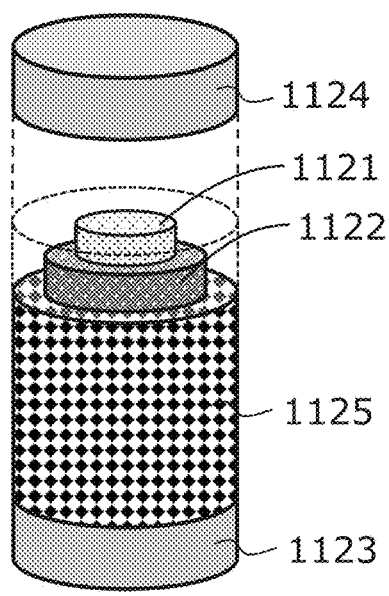
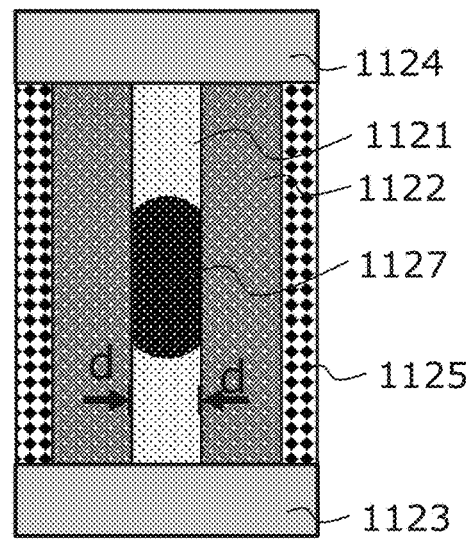
FIG. 11a    FIG. 11b

RESISTIVE MEMORY DEVICE

BACKGROUND

The invention is directed to a resistive memory device comprising a plurality of memory cells, and a related method, a related control unit, a related memory cell, and a related computer program product.

Nanoscale memory devices, whose resistance depends on the history of the electric signals applied, could become critical building blocks in new computing paradigms, such as brain-inspired computing and memcomputing. However, there are key challenges to overcome, such as the high programming power required, noise and resistance drift.

One promising example for resistive memory devices are phase-change memory (PCM) devices. PCM is a non-volatile solid-state memory technology that exploits the reversible, thermally-assisted switching of phase-change materials, in particular chalcogenide compounds such as GST (Germanium-Antimony-Tellurium), between states with different electrical resistance. The fundamental storage unit (the "cell") can be programmed into a number of different states, or levels, which exhibit different resistance characteristics. The s programmable cell-states can be used to represent different data values, permitting storage of information.

In single-level PCM devices, each cell can be set to one of s=2 states, a "SET" state and a "RESET" state, permitting storage of one bit per cell. In the RESET state, which corresponds to an amorphous state of the phase-change material, the electrical resistance of the cell is very high. By heating to a temperature above its crystallization point and then cooling, the phase-change material can be transformed into a low-resistance, fully-crystalline state. This low-resistance state provides the SET state of the cell. If the cell is then heated to a high temperature, above the melting point of the phase-change material, the material reverts to the fully-amorphous RESET state if rapidly cooled afterwards. In multilevel PCM devices, the cell can be set to s>2 programmable states permitting storage of more than one bit per cell. The different programmable states correspond to different relative proportions of the amorphous and crystalline phases within the volume of phase-change material. In particular, in addition to the two states used for single-level operation, multilevel cells exploit intermediate states in which the cell contains different volumes of the amorphous phase within the otherwise crystalline PCM material. Since the two material phases exhibit a large resistance contrast, varying the size of the amorphous phase within the overall cell volume produces a corresponding variation in cell resistance.

Reading and writing of data in PCM cells is achieved by applying appropriate voltages to the phase-change material via a pair of electrodes associated with each cell. In a write operation, the resulting programming signal causes Joule heating of the phase-change material to an appropriate temperature to induce the desired cell-state on cooling. Reading of PCM cells is performed using cell resistance as a metric for cell-state. An applied read voltage causes current to flow through the cell, this current being dependent on the resistance of the cell. Measurement of the cell current therefore provides an indication of the programmed cell state. A sufficiently low read voltage is used for this resistance metric to ensure that application of the read voltage does not disturb the programmed cell state. Cell state detection can then be performed by comparing the resistance metric with predefined reference levels for the s programmable cell-states.

In spite of the success of PCM technology, reducing the RESET current and increasing the cycling endurance will have significant ramifications on the application space of this technology. The RESET current typically scales inversely with the volume of phase change material that is switched. Cycling endurance can be improved if one could avoid elemental segregation and stoichiometric variations that arise during the operation of the device. Another key challenge is that of resistance drift and noise that limits the number of resistance state one can reliably store and retrieve from the memory device.

A document by Wabe W. Koelmans, Abu Sebastian, Vara Prasad Jonnalagadda, Daniel Krebs, Laurent Dellmann & Evangelos Eleftheriou, Nature Communications, 6, 2015, Article number: 8181, introduces the concept of a projected memory device, whose distinguishing feature is that an electrically conductive segment in parallel with the phase change material can reduce the effect of resistance drift and noise in the phase change material's amorphous phase on cell read operations.

Accordingly, there is a need for further improvements of resistive memory devices.

SUMMARY

According to a first aspect, the invention is embodied as a memory device comprising a control unit for controlling the memory device and a plurality of memory cells. The plurality of memory cells comprise a first terminal, a second terminal and a phase change segment comprising a phase-change material for storing information in a plurality of resistance states. The phase change segment is arranged between the first terminal and the second terminal. The phase change material consists of antimony. Furthermore, at least one of the dimensions of the phase change segment is smaller than 15 nanometers (nm).

Such an embodied memory device uses antimony (Sb) as monoatomic phase-change material. Such an embodiment avoids elemental segregation of the phase change material and may offer advantages in terms of enhanced scalability, low operating power as well as high endurance.

Embodiments of the invention may facilitate a scaling of phase-change memory cells down to very small dimensions. Furthermore, embodiments of the invention may facilitate a lower power consumption for phase-change memory as well as an increased endurance.

To facilitate or enable the formation of phase transitions of the antimony phase change material, at least one of the dimensions of the phase change segment 21 is chosen to be smaller than 15 nm. In this respect, the applicant has discovered that it is possible to induce phase transitions in antimony via a melt-quench process and subsequent glass transition if one of the dimensions of the phase change segment is smaller than 15 nm. The dimension that is smaller than 15 nm can be generally any suitable dimension of the phase change segment, e.g. a thickness of the phase change segment or a diameter of the phase change segment.

A possible explanation for this newly discovered effect could be that such small dimensions effect a reduced crystallization rate due to a stabilization of the amorphous phase by the interfaces with the enclosing materials as well as a reduction in the effective thermal resistance which facilitates a very fast quench process.

According to a further embodiment at least one of the dimensions of the phase change segment is smaller than 10 nm. According to a further embodiment at least one of the dimensions of the phase change segment is smaller than 5 nm. This may further improve the amorphization during the melt-quench process and the stability of the amorphous state.

According to a further embodiment, the control unit is configured to apply in a write mode write voltages as electrical programming pulses to the first terminal and the second terminal. Furthermore, the memory cells are surrounded by a thermal environment which is designed such that during the application of the electrical programming pulses the quench-rate is sufficiently high to create an amorphous phase via a melt-quench process and to prevent its re-crystallization. According to embodiments, the memory device and in particular the thermal environment of the memory device are configured such that the temperature of the memory cells approaches the ambient temperature or at least a range of 10 degrees Celsius above the ambient temperature within 12 ns after the beginning of the trailing edge of the respective programming pulse. This facilitates that the quench-rate is sufficiently high.

According to an embodiment the control unit is configured to apply in a write mode write voltages as electrical programming pulses to the first terminal and the second terminal and a slope of the trailing edge of the programming pulses is configured such that the quench-rate is sufficiently high to create an amorphous phase via the melt-quench process and to prevent its re-crystallization.

According to an embodiment, the control unit is configured to apply in a write mode write voltages as electrical programming pulse to the first terminal and the second terminal. The electrical programming pulses have a trailing edge duration of less than 12 nanoseconds (ns).

The trailing edge duration may be defined as the time period of the trailing edge. In other words, the trailing edge duration is the time that it takes to switch/change the voltage level from an upper voltage level of the programming pulses to a lower voltage level of the programming pulses.

A trailing edge duration of less than 12 ns facilitates or enables the formation of phase transitions of the antimony phase change material. According to some embodiments, the trailing edge duration is less than 8 ns. In particular, investigations of the applicant have shown that at room temperature the electrical programming pulses should preferably have such a trailing edge duration of less than 8 ns. Further investigations of the applicant have shown that at lower ambient temperatures trailing edge durations of less than 12 ns may be sufficient to facilitate or enable the formation of phase transitions. One possible reason could be the decrease in the effective quench rate.

According to further embodiments, the trailing edge duration is less than 5 ns. This may further improve the amorphization during the melt-quench process.

According to an embodiment the memory device comprises an electrically conductive segment in parallel to the phase change segment.

Such an electrically conductive segment can be configured to provide an alternate current path during the reading of information stored in the phase change segment.

Such an electrically conductive segment can reduce the effect of resistance drift in the amorphous phase on cell read operations. The electrically conductive segment provides a parallel current path between the first terminal and the second terminal, thereby facilitating a drift-resistant operation regardless of amorphous size.

According to an embodiment, the material of the electrically conducting segment is a semiconductor material such as poly-silicon, a metal such as W or a metal nitride such as TaN, TiAlN or TiN. These materials provide good electrical properties as well as ease of manufacturing.

According to an embodiment, the phase change segment and the electrically conductive segment are arranged adjacent to each other and in electrical contact with each other over substantially the whole length between the first and the second terminal.

According to a further embodiment the control unit is configured to apply in a write mode write voltages as electrical programming pulses to the first terminal and the second terminal and the phase change material is in contact with and/or enclosed by neighboring materials which are chosen in such a way that the amorphous phase of the phase change material is stabilized against re-crystallization by the neighboring materials.

A suitable selection of such neighboring materials, which are arranged adjacent to the phase change material, may inhibit the re-crystallization of the amorphous phase. According to embodiments, poly-silicon, W, or a metal nitride such as TaN, TiAlN or TiN may be used as neighboring material. According to embodiments, the neighboring material may be the material of the electrically conductive segment.

According to an embodiment, the memory cells have a cylindrical shape. Such a geometry offers advantageous options in terms of design and scalability.

According to an embodiment, the phase change segment is formed as plain cylinder of the phase change material. Furthermore, the diameter of the cylinder is less than 15 nm.

According to an embodiment, the memory cells are formed as multilayer-cylinder.

The multilayer-cylinder comprises an inner cylinder of an insulating material and an outer cylinder forming the phase change segment and comprising the phase change material. According to this embodiment, the thickness of the outer cylinder is less than 15 nm.

According to another embodiment, the memory cells have a lamellar shape and the phase change segment is formed as a lamellar having a thickness of less than 15 nm.

According to another embodiment, the memory cells are formed as multi-layer cylinder comprising an inner cylinder forming the electrically conductive segment, a central cylinder forming the phase change segment and comprising the phase change material and an outer cylinder comprising an insulating material. According to this embodiment, the thickness of the central cylinder is the dimension of less than 15 nm.

According to another embodiment, the memory cells are formed as multi-layer cylinder comprising an inner cylinder forming the phase change segment and comprising the phase change material, a central cylinder forming the electrically conductive segment and an outer cylinder comprising an insulating material. According to such an embodiment, the thickness of the inner cylinder is the dimension of less than 15 nm.

According to a further embodiment, the memory device is configured to operate at a temperature range between 10° C. and 25° C. Accordingly, the device can be operated at room temperature. This offers possibilities for mass production and avoids any additional cooling facilities.

According to a further embodiment, the device is provided for storing information in s>2 programmable resistance states. Such multi-level memory facilitates higher memory capacities and integration densities.

According to an embodiment of a second aspect, a memory cell is provided comprising a first terminal, a second terminal and a phase change segment comprising a phase-change material for storing information in a plurality of resistance states. The phase change segment is arranged between the first terminal and the second terminal and the phase change material consists of antimony. Furthermore, at least one of the dimensions of the phase change segment is smaller than 15 nanometers.

According to an embodiment of a third aspect, a method is provided for controlling a memory device according to the first aspect. The method comprises steps of applying, by the control unit, in a read mode a read voltage to the first and the second terminal for reading the resistance state. The method further comprises a step of applying, in a write mode, a write voltage as electrical programming pulse to the first and the second terminal for writing the resistance state. The electrical programming pulse has a trailing edge duration of less than 12 ns.

According to an embodiment of a fourth aspect, a control unit is provided for controlling the operation of a memory device according to the first aspect. The control unit is configured to apply in a read mode a read voltage to the first and the second terminal for reading the resistance state and in a write mode a write voltage as electrical programming pulse to the first and the second terminal for writing the resistance state. The slope of the trailing edge of the programming pulses is configured such that the quench-rate is sufficient to prevent a crystallization of the phase change material. According to an embodiment this is achieved by an electrical programming pulse with a trailing edge duration of less than 12 ns.

According to an embodiment of fifth aspect of the invention, a computer program product is provided for operating a memory device according to the first aspect. The computer program product comprises a computer readable storage medium having program instructions embodied therewith, the program instructions executable by the control unit of the memory device to cause the control unit to perform a method according to the third aspect.

Embodiments of the invention will be described in more detail below, by way of illustrative and non-limiting examples, with reference to the accompanying drawings.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

FIG. 10a shows a 3-dimensional view of a memory cell comprising a multi-layer cylinder according to another embodiment of the invention.

FIG. 10b shows a corresponding cross sectional view of the cell of FIG. 10a.

FIG. 11a shows a 3-dimensional view of a memory cell comprising a multi-layer cylinder according to another embodiment of the invention.

FIG. 11b shows a corresponding cross sectional view of the cell of FIG. 11a.

Throughout the drawings, same or similar reference numerals represent the same or similar elements.

DETAILED DESCRIPTION

In reference to FIGS. 1-12, some general aspects and terms of embodiments of the invention are described.

According to embodiments of the invention, a resistive memory material may be defined as a memory material whose electrical resistance can be changed by applying an electrical signal to the resistive memory material. The electrical signal may be e.g. a current flowing through the device, or an electrical voltage applied to the resistive memory device. The current and/or voltage may be e.g. applied to the resistive memory element in the form of pulses. As a result, the electrical resistance of a resistive memory element depends on the history of current that had previously flown through the device and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g. a chalcogenide. These resistive memory elements exhibit good performance in terms of power consumption, integration density potential, retention, and endurance.

Figure 1:
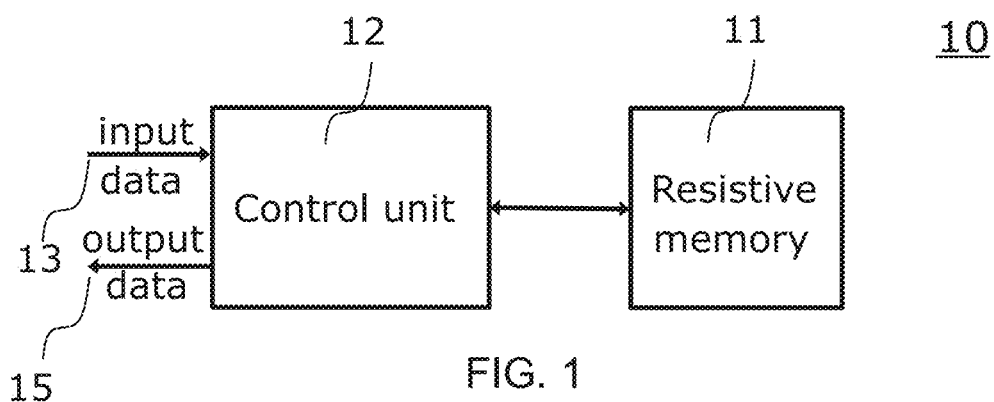
FIG. 1 illustrates a block diagram of a memory device according to an embodiment of the invention.

FIG. 1 is a simplified schematic block diagram of a memory device 10, according to an embodiment of the present invention. The device 10 includes a multilevel resistive memory 11 for storing data in one or more integrated arrays of resistive memory cells described below. Reading and writing of data to memory 11 is performed by a control unit 12. Control unit 12 comprises circuitry of generally known form for programming resistive memory cells during data write operations and making read measurements for detecting cell-state during data read operations. During these operations, the control unit can address individual resistive memory cells by applying appropriate control signals to an array of word and bit lines in the resistive memory 11. User input data 13 to device 10 may be subjected to some form of write-processing, such as coding for error-correction purposes, before being supplied as write signal, in particular as write voltage, to the resistive memory 11. Similarly, read signals received from the resistive memory 11 may be processed by a read-processing module of the control unit 12, e.g. for code-word detection and/or error correction, to recover the original user input data 13 (output as user output data 15.

The resistive memory 11 may be embodied as a phase change memory (PCM). Accordingly the resistive memory 11 comprises a plurality of PCM cells as memory cells. The PCM cells of memory 11 may store information in s=2 or in s>2 programmable resistance states, the latter providing multilevel operation. The s programmable resistance-states correspond to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the amorphous phase within the otherwise crystalline PCM material. The s programmable cell-states are typically defined in control unit 12 in terms of predetermined reference values, or ranges of values, of the resistance metric used for read detection. To program a cell in a write operation, control unit 12 applies a voltage to the cell via the word- and bit-lines such that the resulting programming signal sets the cell to the required state. In a read operation, a (lower) read voltage is applied to the cell and the resulting cell current is measured to obtain the resistance metric. Control unit 12 can then detect the programmed cell state by comparing the read metric with the aforementioned reference values.

The PCM cells of memory 11 comprise antimony (Sb) as phase change material, in particular pure antimony. Accordingly the PCM cells of memory 11 are monoatomic memory cells that utilize a monoatomic phase-change. The advantage of using Sb is that it has the potential to be scaled to ultra-small dimensions and thus very low operating power and it may offer a very high endurance, because the use of the monoatomic antimony avoids elemental segregation. As will be described below in more detail, the use of antimony as phase change material at room temperature can be facilitated according to features of embodiments of the invention.

Figure 2:
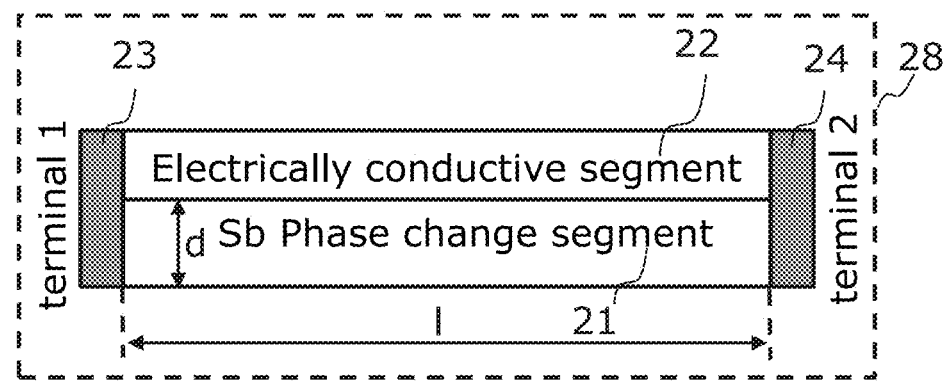
FIG. 2 shows a schematic cross sectional view of a memory cell according to an embodiment of the invention.

FIG. 2 is a schematic cross-sectional view of a memory cell 20, according to an embodiment of the present invention. The memory cell 20 comprises a phase change segment 21 comprising Sb as PCM material for storing information in a plurality s of resistance states which correspond to the programmable cell-states. The memory cell 20 further comprises an electrically conductive segment 22 comprising an electrically conductive or in other words electrically non-insulating material. The phase change segment 21 and the electrically conductive segment 22 are arranged in parallel between a first terminal 23 and a second terminal 24. The first terminal 23 and the second terminal 24 are coupled to the control unit 12. The control unit 12 is adapted to apply control signals to the first terminal 23 and the second terminal 24 and to receive read-back signals from the resistive memory 11. More particularly, the control unit 12 is configured to apply in a write mode a write voltage to the first terminal 23 and the second terminal 24 for writing one of the plurality of resistance states to the memory cell 20. The write voltage is applied in the form of voltage pulses. The voltage pulses act or serve as electrical programming pulses to program the respective resistance state of the memory cell 20. Furthermore, the control unit 12 is configured to apply in a read mode a read voltage to the first terminal 23 and the second terminal 24, thereby reading the respective resistance state of the memory cell 20. According to the embodiment illustrated in FIG. 2, the electrical resistance of the electrically conductive segment 22 has a fixed value. According to other embodiments, a tunable resistance may be used.

According to further embodiments, the resistance of the electrically conductive segment 22 may be tunable, e.g. by applying a control signal to a third terminal (not shown).

The phase change segment 21 and the electrically conductive segment 22 are arranged in electrical contact with each other over substantially the whole length l between the first terminal 23 and the second terminal 24. According to embodiments the resistance of the electrically conductive segment 22 forms a distributed resistance.

In an exemplary implementation of cell 20, the first terminal 23 and the second terminal 24 may be formed of TiN.

The memory cell 20 is surrounded by a thermal environment 28 which is schematically illustrated with a dotted line. The thermal environment 28 represents all the components, elements, layers etc. that surround the memory cell 20 including the first terminal 23 and the second terminal 24 and in particular those components, elements and layers that have a thermal influence on the melt-quench process occurring in the memory cell 20 during its programming. The thermal environment 28 can according to embodiments in particular encompass inter-cell-layers and/or inter-cell components that are arranged between the memory cell 20 for thermal insulation and/or other purposes as well as the first terminal 23 and the second terminal 24.

Figure 3:
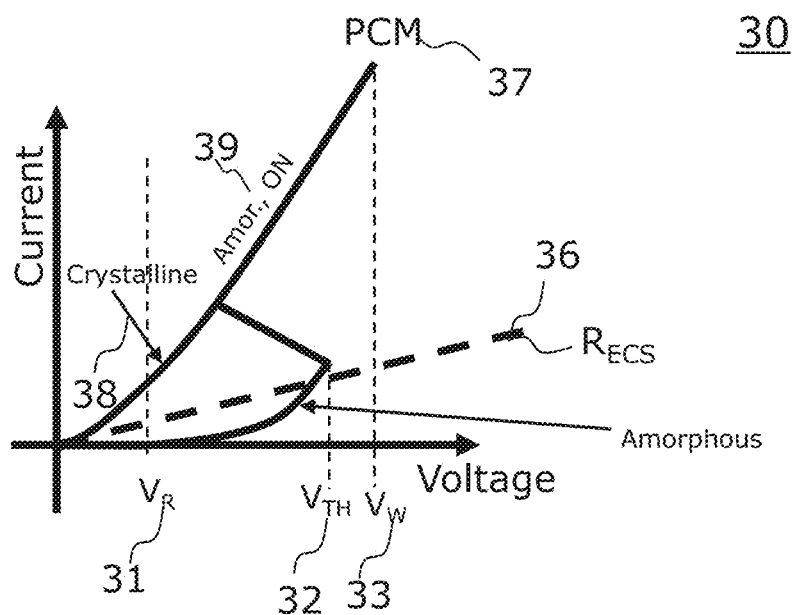
FIG. 3 is a graph which illustrates voltage-current characteristics of operation modes of a memory cell according to an embodiment of the invention.

FIG. 3 is a schematic illustration 30, of the current/voltage (and hence resistance) characteristics of the material components of the memory cell 20 (shown in FIG. 2). The solid lines indicate variation of current with voltage for the Sb material of the phase change segment 21 (shown in FIG. 2), starting from the fully-crystalline SET state (upper curve) and also the fully-amorphous RESET state (lower curve). These two curves reflect the large (typically 3 orders of magnitude) variation in resistivity between the crystalline and amorphous phases. The dashed line 36 in the plot indicates the current/voltage characteristic for the electrically conductive segment 22. It can be seen that, at low voltages including the cell read voltage 31, the resistance of the electrically conductive segment 22 is between that of the amorphous and crystalline phases of the phase change segment 21 (shown in FIG. 2). The amorphous phase exhibits a non-linear characteristic with a threshold switching phenomenon that is field induced. At a certain threshold voltage $V_{TH}$ 32, this phase switches to a very low "ON-state" resistance corresponding to that of the crystalline PCM material. The cell programming (write) voltage 33 is selected to be above this threshold voltage as indicated. At this voltage, the ON-resistance of the phase change segment 21 is much less than the resistance $R_{ECS}$ of the electrically conductive segment 22. Accordingly, the write-current is substantially unaffected by the presence of the electrically conductive segment 22.

Based on the above principles, preferred cell arrangements are embodied such that, at the cell read voltage, the resistance $R_{ECS}$ 36 of the electrically conductive segment 22 is chosen such that it is far from both the resistance $R_{amo}$ of the fully-amorphous (RESET) state, and also the resistance $R_{cry}$ 38 of the fully-crystalline SET state, of the PCM 37 material (where "far" here means far within the context of the resistance range from $R_{cry}$ 38 to $R_{amo}$ 39). In general, an appropriate value for RECS in this range will depend on various factors such as the materials and dimensions of cell components, the particular characteristics of the s programmable cell states, the operating parameters (e.g. read and write voltages) of memory device 10 as well as desired performance criteria such as maximum acceptable error-rate. In general, however, the arrangement is preferably such that $R_{ECS} \gg R_{cry}$ 38 and $R_{ECS}$ 36 $\ll R_{amo}$ 39 within the context of the aforementioned range.

Due to resistance characteristics described above, the effect of resistance drift in the amorphous phase on cell read operations can be significantly reduced. More particularly, the ratio of currents that flows through the phase change segment 21 and the electrically conductive segment 22 can be chosen by an appropriate choice of the resistance $R_{ECS}$ 36. The electrically conductive segment 22 provides a full parallel current path between the terminals 23, 24, providing drift-resistant operation regardless of amorphous size. Moreover, any residual drift effect (due to the very small current flowing through the amorphous phase) will exhibit low variability at different cell states. By choosing the resistance of the full parallel current path the very small current flowing through the amorphous phase can be tuned and it can be ensured that current through the electrically conductive segment 22 will dominate as desired.

In effect, the programmed resistance state of the memory cell 20 can be considered to be projected onto the resistance of the electrically conductive segment 22 in a cell read voltage 31. During the low-field read process, the current bypasses the highly resistive amorphous region of the phase change segment 21 and flows through that part of the electrically conductive segment 22 that is parallel to it. Accordingly the length of the current path through the electrically conductive segment 22 reflects the amorphous size and hence the programmed resistance state. In other words, the electrically conductive segment 22 may be considered as a projection segment during the read operation. The information that is typically stored into the length of the amorphous region in the phase change segment 21 is in a sense projected onto the electrically conductive segment 22.

It should be noted that even though the electrically conductive segment 22 is present during both the read and the write operation, according to embodiments the "projection" is designed to occur only during the read process. In effect, therefore, embodiments of the invention provide a decoupling of the read process and the write process.

To facilitate or enable the formation of phase transitions of the antimony phase change material, at least one of the dimensions of the phase change segment 21 is smaller than 15 nm. In the embodiment illustrated in FIG. 2, the thickness d of the phase change segment 21 is chosen as dimensions with less than 15 nm.

In this respect, investigations of the applicant have revealed the effect that it is possible to induce phase transition via the melt-quench process and subsequent glass transition if one of the dimensions of the phase change segment 21, e.g. the thickness d, is not larger than 15 nm.

A possible explanation could be that such small dimensions effect a reduced crystal growth rate in view of the reduced surface area between the crystalline and amorphous phases as well as a reduction in the effective thermal resistance which facilitates a very fast quench process.

Further investigations of the applicant have confirmed that such an amorphous phase exhibits the drift behavior that is characteristic of phase change materials. Furthermore, such an amorphous phase has been found to be stable over extended periods of time.

These investigations and studies of the applicant have resulted in the conclusion that in a Sb-based memory device, at least one of the dimensions of the phase change segment 21 should be smaller than 15 nm.

As mentioned above, the control unit 12 is configured to apply in a write mode write voltages as electrical programming pulses to the first terminal 23 and the second terminal 24.

According to embodiments, the electrical programming pulses have a trailing edge duration of less than 12 ns.

Figure 4:
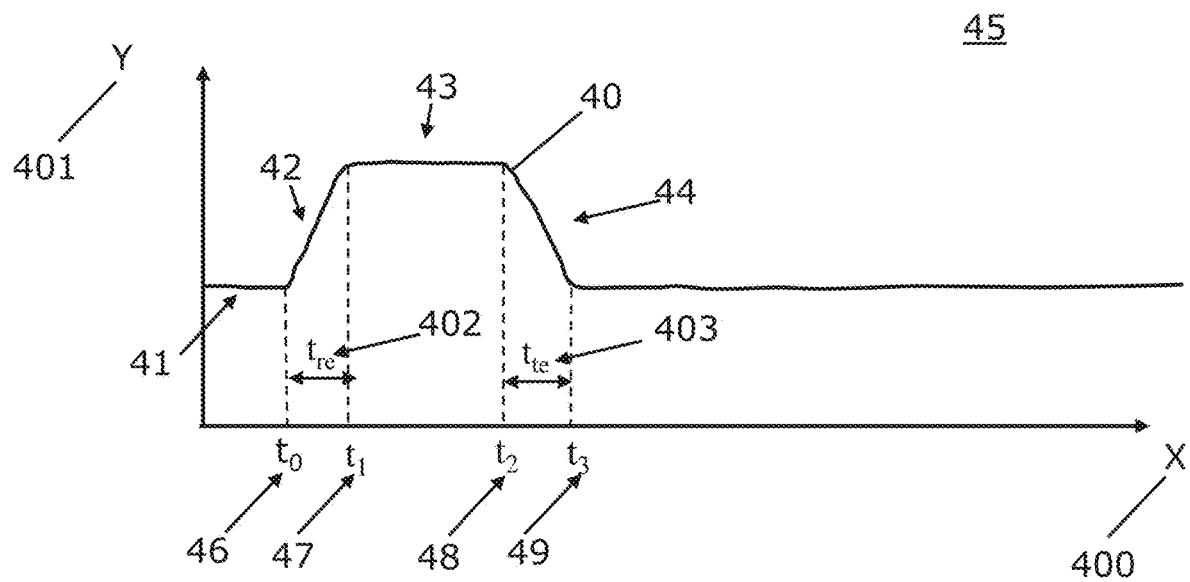
FIG. 4 is a graph which illustrates an example of a programming pulse.

FIG. 4 illustrates a graph 45, depicting an example of a programming pulse 40. The x-axis 400 denotes the time in nanoseconds (ns) and the y-axis 401 the voltage in V.

The electrical programming pulse 40 comprises a lower voltage level 41, a rising edge 42, an upper voltage level 43 and a trailing edge 44. More particularly, the electrical programming pulse has an initial lower voltage level 41. The initial lower voltage level 41 may be in particular a voltage level of zero. From the initial voltage level 41 the electrical programming pulse 40 rises during the rising edge 42 from the lower voltage level 41 to the upper voltage level 43. In this example the upper voltage level may be e.g. 4.5 V. The upper voltage level 43 is kept for a predefined period of time, e.g. for 40 ns. Then the electrical programming pulse 40 declines from the upper voltage level 43 to the lower voltage level 41 during the trailing edge 44.

According to embodiments, the trailing edge duration $t_{te}$ 403 may be defined as the time period/the time interval of the trailing edge 44. In other words, the trailing edge duration $t_{te}$ 403 is the time that it takes to switch/change the voltage level from the upper voltage level 43 of the programming pulses 40 to the lower voltage level 41 of the programming pulses 40.

Referring to FIG. 4, the electrical programming pulse 40 starts to rise at a point in time $t_0$ from the lower voltage level 41 and reaches at a point in time $t_1$ the upper voltage level 43. Accordingly the duration $t_{re}$ 402 of the rising edge 42 is the time period between $t_0$ 46 and $t_1$ 47.

Then at a point in time $t_2$ the electrical programming pulse 40 starts to decline from the upper voltage level 43 and reaches at a point in time $t_3$ 49 again the lower voltage level 41. Accordingly the duration $t_{te}$ 403 of the trailing edge 44 is the time period between $t_2$ 48 and $t_3$ 49.

Investigations of the applicant with respect to the quench rate have revealed that ultra-fast quench rates facilitate or enable the formation of phase transitions of the antimony phase change material. In particular, investigations of the applicant have shown that at room temperature the electrical programming pulses should have a trailing edge duration $t_{te}$ 403 of less than 8 ns. Further investigations of the applicant have shown that at lower ambient temperatures trailing edge durations of less than 12 ns may be sufficient to facilitate or enable the formation of phase transitions. One possible reason could be the decrease in the effective quench rate.

Hence according to some embodiments the trailing edge duration $t_{te}$ 403 of the electrical programming pulses should be less than 12 ns and according to other embodiments the trailing edge duration $t_{te}$ 403 should be less than 8 ns.

According to embodiments, the memory device and in particular the thermal environment of the memory cell 20 of FIG. 2 are configured such that the temperature of the memory cell 20 approaches the ambient temperature or at least a range of 10 degrees Celsius above the ambient temperature within 12 ns after the beginning of the trailing edge of the respective programming pulse, i.e. within 12 ns after $t_2$ 48. As an example, assuming an ambient temperature of 25 degree Celsius, the memory device is configured such that the temperature of the memory cells drop to 35 degree Celsius or less within 12 ns after $t_2$ 48. This facilitates that the quench-rate is sufficiently high.

Figure 5:
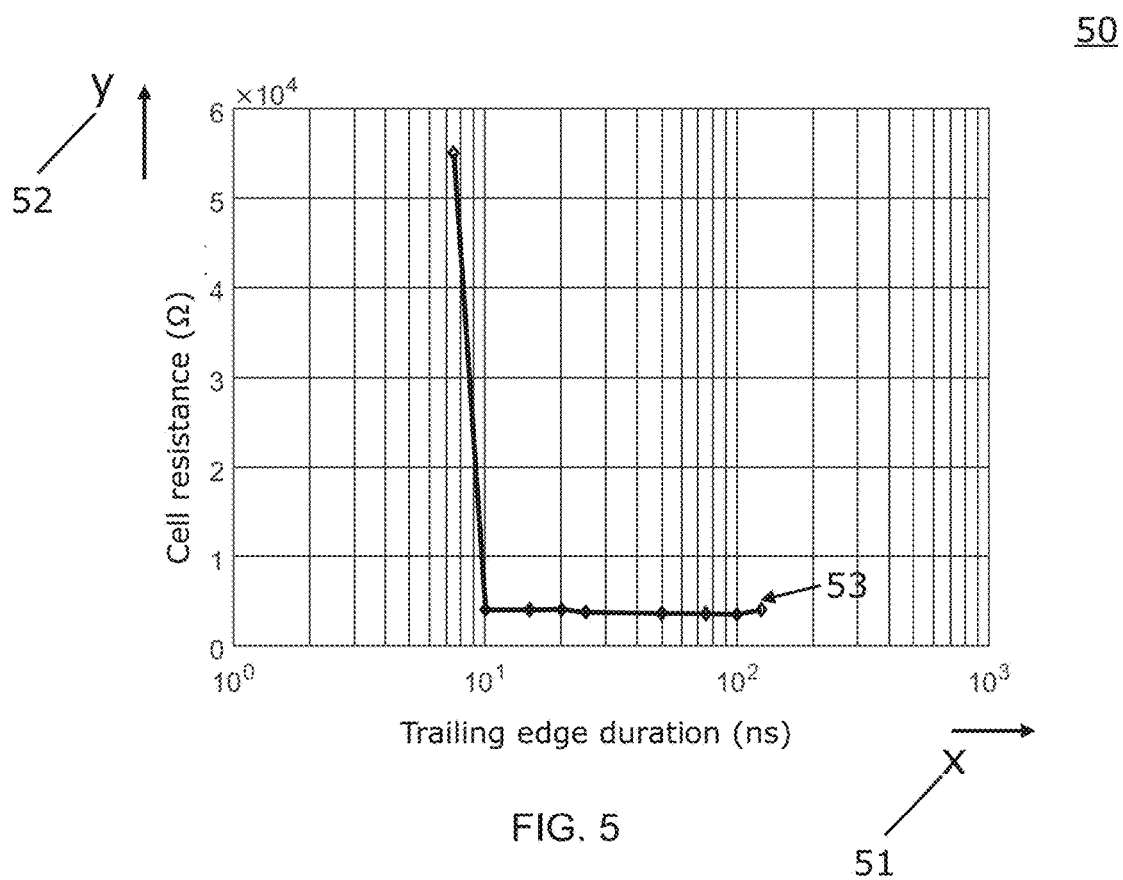
FIG. 5 is a graph which illustrates experimental data of programming pulses with different trailing edge durations and the associated amorphization.

FIG. 5 illustrates a graph 50, depicting experimental data of electrical programming pulses that have been applied to an exemplary memory cell with different trailing edge durations.

The x-axis 51 denotes the respective trailing edge duration $t_{te}$ 403 (shown in FIG. 4) in ns and the y-axis 52 the corresponding resistance in Ohm of the corresponding memory cell having antimony as phase change material. The trailing edge duration was made shorter with every next programming pulse. The results of the experiment are represented as a plot line 53. The experiment was performed at room temperature with memory cells comprising an antimony phase change segment in lamellar form having a thickness of 5 nm. In parallel to the phase change segment an electrically conductive layer of TaN was provided with a thickness of 6 nm. The experiment confirms that a short trailing edge facilitates the amorphization of the antimony. More particularly, above a threshold of 10 ns there was hardly any amorphization observed, while at a trailing edge duration of 6-8 ns already a significant amorphization occurred.

FIGS. 6-11 provide 3-dimensional views and associated cross sectional views of memory cells according to exemplary embodiments of the invention. As can be seen in these figures, the memory cells may have a cylindrical shape or a lamellar shape. Such shapes may facilitate advanced and efficient device manufacturing as well as dense device integration.

Figure 6:
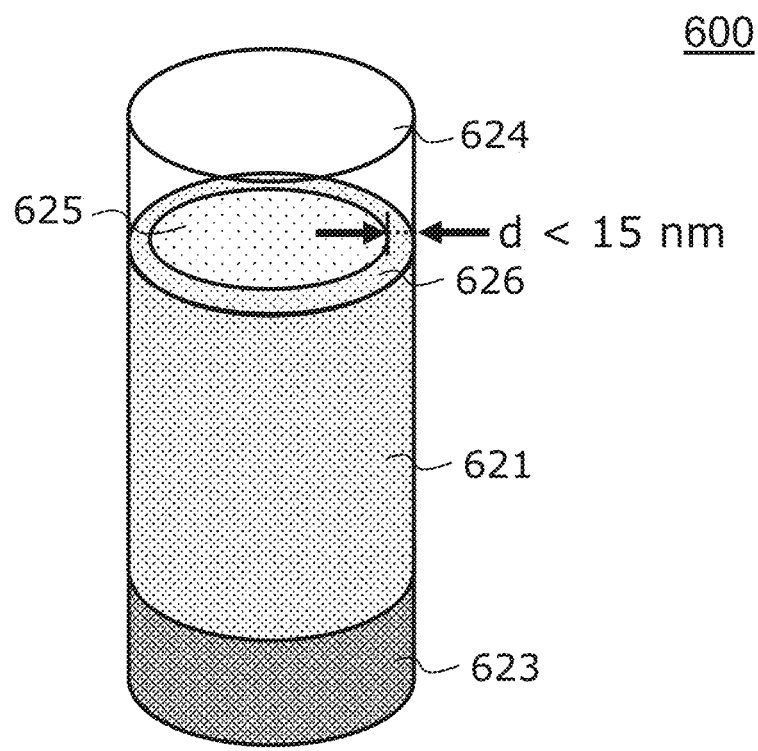
FIG. 6 shows a 3-dimensional view of a memory cell according to an embodiment of the invention.

FIG. 6 shows a 3-dimensional view of a memory cell 600 according to an embodiment of the invention. The memory cell 600 is formed as multilayer-cylinder comprising an inner cylinder 625. The inner cylinder 625 comprises an insulating material. The memory cell 600 further comprises an outer cylinder 626 forming a phase change segment 621 and comprising antimony as phase change material. The outer cylinder 626 is formed as hollow cylinder and the thickness d of the outer cylinder 626 is less than 15 nm. The phase change segment 621 is arranged between a first terminal 623 and a second terminal 624.

Figure 7:
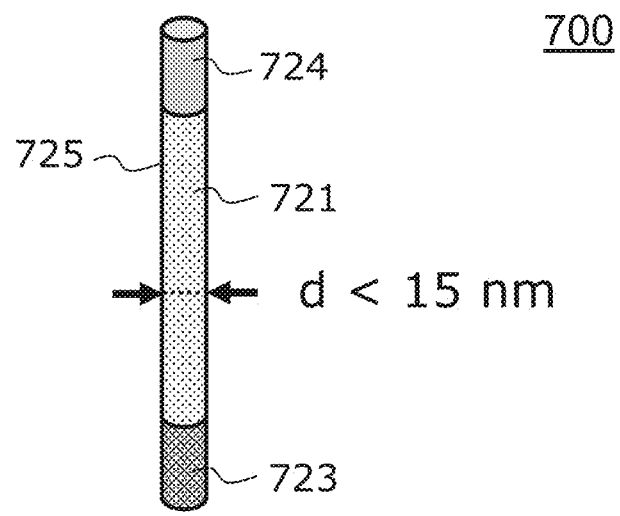
FIG. 7 shows a 3-dimensional view of a memory cell according to another embodiment of the invention.

FIG. 7 shows a 3-dimensional view of a memory cell 700 according to an embodiment of the invention. The memory cell 700 comprises a phase change segment 721 of antimony. The phase change segment 721 is formed as plain cylinder 725 of the phase change material antimony. The phase change segment 721 is arranged between a first terminal 723 and a second terminal 724. The diameter d of the cylinder 725 establishes a dimension that is less than 15 nm.

Figure 8:
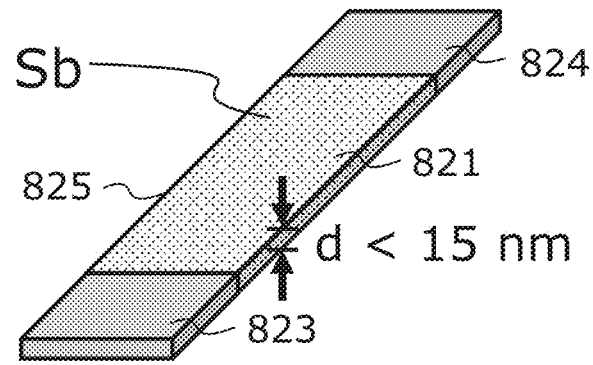
FIG. 8 shows a 3-dimensional view of a memory cell according to another embodiment of the invention.

FIG. 8 shows a 3-dimensional view of a memory cell 800 according to an embodiment of the invention. The memory cell 800 has a lamellar shape and comprises a phase change segment 821 that is formed as a lamellar 825. The lamellar 825 has a thickness d of less than 15 nm as dimension that is smaller than 15 nm. The phase change segment 821 is arranged between a first terminal 823 and a second terminal 824.

Figure 9:
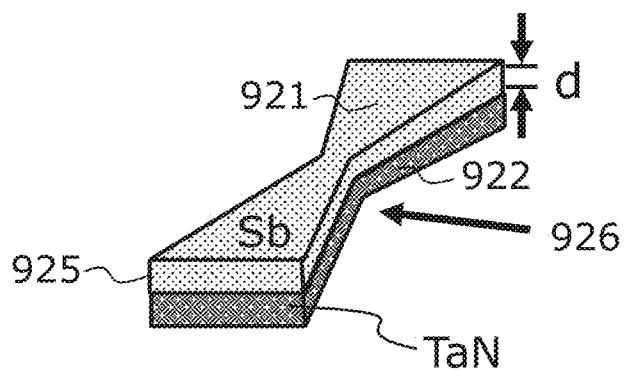
FIG. 9 shows a 3-dimensional view of a memory cell according to another embodiment of the invention.

FIG. 9 shows a 3-dimensional view of a part of a memory cell 900 according to another embodiment of the invention. The memory cell 900 has also a lamellar shape and comprises a phase change segment 921 that is formed as a lamellar 925. The lamellar 925 comprises a central restriction 926. The lamellar 925 has as restricted dimension a thickness d of less than 15 nm, e.g. 3 nm. The memory cell 900 further comprises an electrically conductive segment 922 comprising an electrically conductive material. The phase change segment 921 and the electrically conductive segment 922 are arranged in parallel. The part of the memory cell 900 that is shown in FIG. 9 is configured to be arranged between a first terminal and a second terminal which are not shown in FIG. 9.

FIG. 10a shows a 3-dimensional view of a memory cell 1000 according to another embodiment of the invention. FIG. 10b shows a corresponding cross sectional view. The memory cell 1000 is formed as multi-layer cylinder. The memory cell 1000 comprises an inner cylinder 1022 forming the electrically conductive segment. The memory cell 1000 further comprises a central cylinder 1021 forming the phase change segment 1027 and comprising antimony as phase change material. In addition, the memory cell 1000 comprises an outer cylinder 1025 comprising an insulating material. According to this embodiment the thickness d of the central cylinder 1021 is less than 15 nm and establishes a dimension of the phase change segment that is smaller than 15 nm.

The central cylinder 1021 and the electrically conductive segment 1022 are arranged in parallel between a first terminal 1023 and a second terminal 1024. The first terminal 1023 and the second terminal 1024 are coupled to the control unit 12 of FIG. 1.

FIG. 11a shows a 3-dimensional view of a memory cell 1100 according to another embodiment of the invention. FIG. 11b shows a corresponding cross sectional view. The memory cell 1100 is also formed as multi-layer cylinder. The memory cell 1100 comprises an inner cylinder 1121 forming a phase change segment 1127 and comprising antimony as phase change material. The memory cell 1100 further comprises a central cylinder 1122 forming the electrically conductive segment 22 (shown in FIG. 2). In addition, the memory cell 1100 comprises an outer cylinder 1125 comprising an insulating material. According to this embodiment the thickness d of the inner cylinder 1121 which corresponds to the diameter of the inner cylinder 1121 is less than 15 nm and establishes a dimension of the phase change segment 21 (shown in FIG. 2) that is smaller than 15 nm.

The inner cylinder 1121 and the central cylinder 1122 are arranged in parallel between a first terminal 1123 and a second terminal 1124. The phase change segment 1127 is located within the inner cylinder 1121. The first terminal 1123 and the second terminal 1124 are coupled to the control unit 12 of FIG. 1.

The memory cells of FIGS. 6-11 can be fabricated using well-known material processing techniques for formation of the various elements of the cell. By way of example, the cylindrical structure may be produced by a keyhole-transfer process as described in Raoux et al., IBM J. Res. & Dev. 52(4/5), 465 (2008), (see FIG. 6 thereof). In general, however, the materials and dimensions of the cells are selected to satisfy the particular needs of the respective application.

Figure 12:
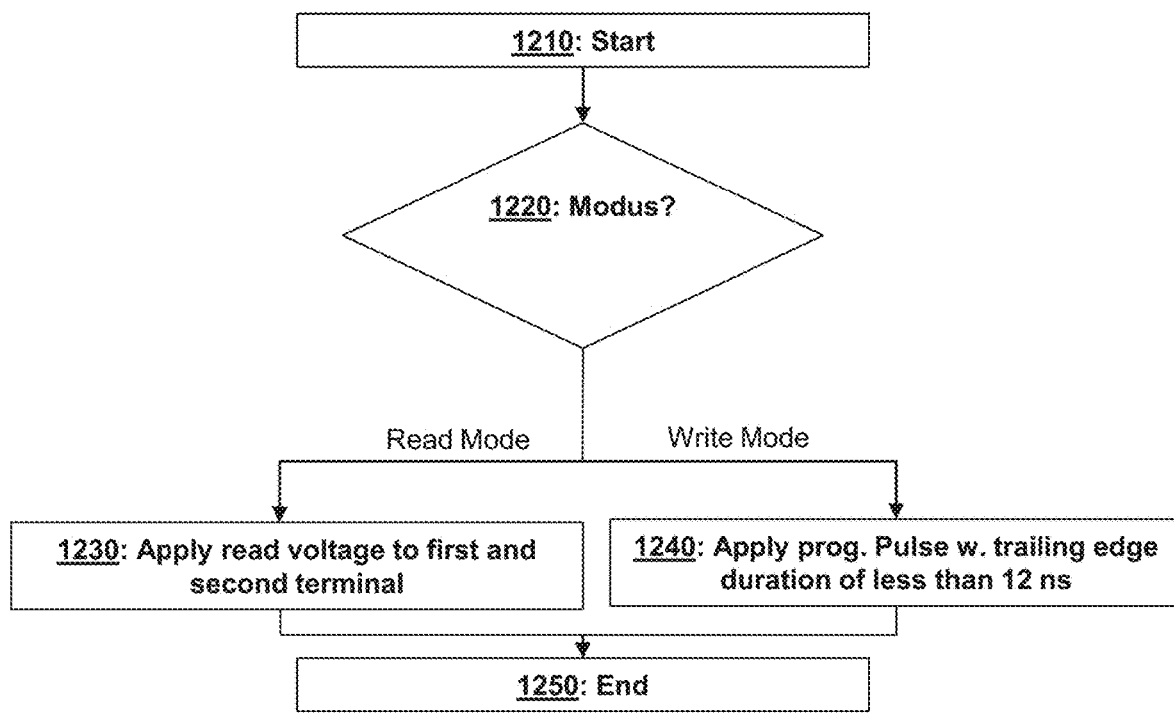
FIG. 12 shows a flow chart of method steps of a method for operating a memory device according to an embodiment of the invention.

FIG. 12 shows a flow chart of method steps of a method for operating a memory device, e.g. the memory device 10 of FIG. 1.

At a step 1210, the method is started.

At a step 1220, the control unit 12 checks the mode of operation, namely whether a read operation or a write operation shall be performed.

If the device 10 shall operate in the read mode, the control unit 12 applies at a step 1230 a read voltage to the first and the second terminal for reading the resistance state.

If the device 10 shall operate in the write mode, the control unit 12 applies at a step 1240 a write voltage as electrical programming pulse to the first and the second terminal and writes thereby the resistance state of the respective memory cell. To ensure that the corresponding melt-quench process is fast enough to effect an amorphization of the phase change material, the electrical programming pulse has a trailing edge duration of less than 12 ns.

At a step 1250, the method stops and the memory device 10 may start again with step 1210.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, the electrically conductive segment 22 may be formed of any suitable material. Examples of such materials include semiconductors such as silicon or germanium (with and without doping) and in particular poly-silicon and TaN as mentioned above. The first and the second terminal may be formed of any convenient electrically-conductive material, typically a metallic material (e.g. a pure metal or a metal compound, alloy or other mixture) or a doped semiconductor material such as silicon.

Moreover, the features described may be applied to single-level as well as multi-level cells.

In general, modifications described for one embodiment may be applied to another embodiment as appropriate.

What is claimed is:

1. A memory device comprising:
a memory cell comprising:
a first terminal;
a second terminal;
a phase change segment comprising a phase-change material for storing information in a plurality of resistance states, wherein the phase change segment is arranged between the first terminal and the second terminal, the phase change material consisting of antimony, and the phase change segment dimensioned to retain an amorphous region during a write operation to the memory cell; and
a control unit for controlling the write operation to the memory cell, the control unit electrically connected to the first terminal and the second terminal of the memory cell and configured to, in the write mode, apply a write voltage as an electrical programming pulse to the first terminal and the second terminal of the memory cell, wherein:
the write voltage is sufficient to cause a portion of the phase change segment to transition from a crystalline phase to an amorphous phase comprising the amorphous region;
the electrical programming pulse has a trailing edge slope that produces a quench-rate sufficient to prevent re-crystallization of the amorphous region; and
the control unit adjusts a trailing edge duration of the trailing edge slope based on an ambient temperature, the control unit utilizing shorter trailing edge durations as the ambient temperature increases.

2. The memory device according to claim 1, wherein the control unit is configured to limit the trailing edge duration to less than 8 nanoseconds when the ambient temperature is room temperature.

3. The memory device according to claim 2, wherein at least one dimension of the phase change segment is less than 15 nanometers.

4. The memory device according to claim 1, wherein the control unit is configured to limit the trailing edge duration to less than 12 nanoseconds when the ambient temperature is less than room temperature.

5. The memory device according to claim 4, wherein at least one dimension of the phase change segment is less than 15 nanometers.

6. The memory device according to claim 1, wherein the control unit is configured to cause a temperature of the memory cell to drop 35 degrees Celsius or less within 12 nanoseconds of a beginning of the trailing edge slope when the ambient temperature is 25 degrees Celsius.

7. The memory device according to claim 1, wherein the control unit is configured to cause a temperature of the memory cell to drop within a range of 10 degrees Celsius above the ambient temperature when the electrical programming pulse reaches a lower voltage representing an end of the trailing edge slope.

8. The memory device according to claim 7, wherein the electrical programming pulse is held at an upper voltage level for at least 40 nanoseconds to cause the portion of the phase change segment to transition from the crystalline phase to the amorphous phase, a voltage at a beginning of the trailing edge slope corresponding to the upper voltage.

9. The memory device according to claim 1, the memory cell further comprising:
an electrically conductive segment arranged adjacent to the phase change segment between the first terminal and the second terminal, a surface of the electrically conductive segment in electrical contact with a corresponding surface of the phase change segment over substantially all of the surface and the corresponding surface, the electrically conductive segment having a thickness of 5 nanometers measured perpendicular to the surface in electrical contact with the phase change segment, the phase change segment having a thickness of 6 nm measured perpendicular to the corresponding surface in electrical contact with the electrically conductive segment, and the control unit configured to apply an electrical programming pulse having a trailing edge duration of 6-8 nanoseconds during a write operation at room temperature.

10. The memory cell accordingly to claim 1, wherein a volume of the amorphous region corresponds to one or more intermediate resistance states within the plurality of resistance states, each intermediate resistance state representing a respective value of the volume of the amorphous region.

11. A method for operating a memory device, comprising:
interfacing a control unit with a memory cell, the memory cell comprising:
a first terminal electrically connected to the control unit;
a second terminal electrically connected to the control unit; and
a phase change segment comprising a phase-change material for storing information in a plurality of resistance states, wherein the phase change segment is arranged between the first terminal and the second terminal, the phase change material consisting of antimony, and the phase change segment dimensioned to retain an amorphous region during a write operation to the memory cell;
applying, by the control unit, a write voltage as an electrical programming pulse to the first and the second terminal during a write operation, wherein:
the write voltage is sufficient to cause a portion of the phase change segment to transition from a crystalline phase to an amorphous phase comprising the amorphous region; and the electrical programming pulse has a trailing edge slope that produces a quench-rate sufficient to prevent re-crystallization of the amorphous region; and adjusting, by the control unit, a trailing edge duration of the trailing edge slope based on an ambient temperature, the control unit configured to utilize shorter trailing edge durations as the ambient temperature increases.

12. The method of operating a memory device of claim 11, wherein the control unit is configured to limit the trailing edge duration to less than 8 nanoseconds when the ambient temperature is room temperature.

13. The method operating a memory device of claim 11, wherein the control unit is configured to limit the trailing edge duration to less than 12 nanoseconds when the ambient temperature is less than room temperature.

14. The method operating a memory device of claim 11, wherein the control unit is configured to cause a temperature of the memory cell to drop to less than 35 degrees Celsius within 12 nanoseconds of a beginning of the trailing edge slope when the ambient temperature is 25 degrees Celsius.

15. The method operating a memory device of claim 11, wherein the control unit is configured to cause a temperature of the memory cell to drop to within a range of 10 degrees Celsius above the ambient temperature when the electrical programming pulse reaches a lower voltage representing an end of the trailing edge slope.

16. A computer program product for operating a memory device, the computer program product comprising a computer readable storage medium having program instructions stored thereon, wherein the computer readable storage medium is not a transitory signal per se, the program instructions comprising:

program instructions to interface a control unit with a memory cell, the memory cell comprising:
 a first terminal electrically connected to the control unit;
 a second terminal electrically connected to the control unit; and
 a phase change segment comprising a phase-change material for storing information in a plurality of resistance states, wherein the phase change segment is arranged between the first terminal and the second terminal, the phase change material consisting of antimony, and the phase change segment dimensioned to retain an amorphous region during a write operation to the memory cell; and program instructions to apply, by the control unit, a write voltage as an electrical programming pulse to the first and the second terminal during a write operation, wherein:
 the write voltage is sufficient to cause a portion of the phase change segment to transition from a crystalline phase to an amorphous phase comprising the amorphous region; and
 the electrical programming pulse has a trailing edge slope that produces a quench-rate sufficient to prevent re-crystallization of the amorphous region; and program instructions to adjust, by the control unit, a trailing edge duration of the trailing edge slope based on an ambient temperature, the control unit configured to utilize shorter trailing edge durations as the ambient temperature increases.

17. The computer program product for operating a memory device of claim 16, wherein the control unit is configured to limit the trailing edge duration to less than 8 nanoseconds when the ambient temperature is room temperature.

18. The computer program product for operating a memory device of claim 16, wherein the control unit is configured to limit the trailing edge duration to less than 12 nanoseconds when the ambient temperature is less than room temperature.

19. The computer program product for operating a memory device of claim 16, wherein the control unit is configured to cause a temperature of the memory cell to drop to less than 35 degrees Celsius within 12 nanoseconds of a beginning of the trailing edge slope when the ambient temperature is 25 degrees Celsius.

20. The computer program product for operating a memory device of claim 16, wherein the control unit is configured to cause a temperature of the memory cell to drop to within a range of 10 degrees Celsius above the ambient temperature when the electrical programming pulse reaches a lower voltage representing an end of the trailing edge slope.

* * * * *